(12) United States Patent
Nowoczynski

(10) Patent No.: US 11,171,666 B2
(45) Date of Patent: Nov. 9, 2021

(54) METHOD FOR EFFICIENT ERASURE CODED GROUP MANAGEMENT IN SHARED NOTHING STORAGE CLUSTERS

(71) Applicant: Paul Joseph Nowoczynski, Brooklyn, NY (US)

(72) Inventor: Paul Joseph Nowoczynski, Brooklyn, NY (US)

(*) Notice: Subject to any disclaimer, the term of this patent is extended or adjusted under 35 U.S.C. 154(b) by 0 days.

(21) Appl. No.: 17/105,286

(22) Filed: Nov. 25, 2020

(65) Prior Publication Data

US 2021/0159914 A1    May 27, 2021

Related U.S. Application Data

(60) Provisional application No. 62/940,376, filed on Nov. 26, 2019.

(51) Int. Cl.
*H03M 13/00* (2006.01)
*H03M 13/05* (2006.01)
*G06F 11/10* (2006.01)

(52) U.S. Cl.
CPC ........ *H03M 13/05* (2013.01); *G06F 11/1004* (2013.01); *H03M 13/611* (2013.01)

(58) Field of Classification Search
None
See application file for complete search history.

(56) References Cited

U.S. PATENT DOCUMENTS

| | | | | |
|---|---|---|---|---|
| 8,595,595 | B1* | 11/2013 | Grcanac | G06F 11/1088 714/770 |
| 2020/0117362 | A1* | 4/2020 | McCarthy | G06F 3/0652 |
| 2020/0117372 | A1* | 4/2020 | Corey | G06F 3/067 |
| 2021/0019067 | A1* | 1/2021 | Miller | G06F 3/0641 |

OTHER PUBLICATIONS

J. Xian, L. Zhang and H. Hou, "Efficient Updates in Erasure-Coded Storage Systems," 2019 3rd International Conference on Electronic Information Technology and Computer Engineering (EITCE), 2019, pp. 1570-1575, doi: 10.1109/EITCE47263.2019.9094891. (Year: 2019).*

* cited by examiner

Primary Examiner — Daniel F. McMahon
(74) Attorney, Agent, or Firm — Power Del Valle LLP; Marguerite Del Valle

(57) ABSTRACT

An improvement in erasure coded group management shared nothing storage clusters establishing an invariant which declares read-modify-writes will not be done by the system and implements a metadata distribution operation to provide fault tolerance.

9 Claims, 13 Drawing Sheets

"Storage System Endpoint (SSE)"

"SSE Metablock Recovery Process"

"SSE Data Block Recovery Process"

METHOD FOR EFFICIENT ERASURE CODED GROUP MANAGEMENT IN SHARED NOTHING STORAGE CLUSTERS

FIELD OF THE INVENTION

The present invention is directed to computer information storage where the stored data are distributed across a multitude of computers where each computer may have one or more storage devices, such as hard drives or a solid state drives. The computers containing storage devices are connected to one another via a network such as ethernet.

Terminology and Acronyms

Block Device (BD)—a "block device" can be defined as a computer storage entity which contains a set number of entities (blocks) which are fixed-sized and provides access methods to the entities such as read, write, or trim. Operations on a block always affect the entire block as it is the minimum unit of access. Block devices have traditionally been associated with some sort of physical hardware, such as a hard disk drive or solid-state drive, however, the term may also apply to storage interfaced from a RAID controller or a network device.

Virtual Block Device (VBD)—Similar to a block device from the perspective of the user, who is presented with a set of fixed-sized blocks and accessibility methods. However, the backend is not a hardware provider but rather another set of software methods which provide the semantic and functional equivalents of a hardware based system. Software backends still eventually interface with a physical device to perform the requested storage operation but only after passing through some system defined abstraction methods. The feature perhaps most emblematic of VBDs is "thin provisioning" or the ability to allocate a volume of requested size to a user without immediately claiming the equivalent amount of physical capacity. Advanced abstraction layers are able to provide a VBD with complex features such as snapshots, deduplication, inline replication, compression, etc.

Storage System Endpoint (SSE)—A system process which is tied to an interface capable of reading and writing VBD blocks, both parity and data. The SSE system process may process interfaces with a dedicated physical storage device, such as a hard disk or solid state drive, or a software API, such as Amazon Elastic Block Store or Amazon S3 Object store. The process is able to serve blocks to users via a network socket interface such as TCP/IP.

BACKGROUND

The disclosure submitted in this document lies in the area of distributed computer storage, where logical data volumes span multiple servers, containing one or more physical storage devices, where the servers are connected via a network such as Ethernet. "Shared-nothing" is industry jargon for a set of computers which, by design, have private bus connectivity to their local memory and storage subsystems but are still interconnected via a networking interface. Over the last two decades there has been a huge shift towards shared-nothing architectures due to the cost advantages and flexibility gained through the use of commodity computing and storage hardware. Distributed, fault tolerant storage software stacks which make use of shared-nothing hardware, such as Ceph and Hadoop (HDFS), have seen wide adoption over this time frame.

Distributed computer storage systems using shared-nothing hardware architectures have seen mass adoption across the cloud computing and internet services industries. Some advantages these systems provide come in the form of low relative cost (when compared to their "enterprise" equivalents), support for multitudes of commodity hardware platforms, flexible scaling for massive workloads, and high availability for production use. Despite this widespread adoption, existing shared-nothing storage architectures generally rely on distributed data replication to provide high availability (HA) and fault tolerance. Architectures employing distributed replication for their HA strategy are generally considered to be less complicated to implement and maintain than those based on distributed erasure coding, which is an alternative HA and fault tolerant method which requires less storage capacity. The perceived complexity of distributed erasure coding, coupled with the extremely low cost of hard drive capacity, were key drivers in the decisions taken by the developers of shared-nothing storage systems, like Ceph and HDFS, to pursue an HA strategy based on distributed replication. The obvious downside of any replication strategy is the required capacity overhead. A system employing three replicas for HA requires the administrator to purchase and maintain a system which is three times as large as the application requirement where only one-third is that system's resources are available for use by applications.

The lower overhead alternative to distributed replication is distributed erasure coding. Distributed erasure coding can provide HA using a capacity overhead ratio which is fractional instead of multiplicative.

As commonly applied in the art of storage system's development, a "code word" is a set of equally sized blocks composed of two component types. These are the "N" components, which are raw application data, and the "M" components which are specifically calculated products using the set of N components as parameters. Each of the set of N components must be available in the memory of the erasure coding processor such that a valid set of M components may be amalgamated. The M components cannot produce application data by themselves—they must be combined with some number of N, and possibly additional M, components to do so. In this disclosure 'M' blocks may be referred to as "parity" blocks and 'N' blocks are referred to as "data" blocks. With this, an erasure coded group's geometry can be described as "N+M", where N is the number of data blocks and M is the number of parity blocks. The sum of N and M give the total size of the group. The number of overlapping failures which an N+M group may tolerate is equal to that group's M value. Lastly, the minimum number of group members required to reconstruct any single member is equal to the group's N value.

The fractional capacity overhead of an erasure coded system may be determined simply by considering the group's N and M values. The percentage of capacity needed for parity information is (M/N*100). As an example, a group with N=8 and M=2 (8+2) would have a redundancy overhead of 25% and be able to withstand 2 overlapping failures.

The three-way replication previously mentioned can also withstand two overlapping failures, however, it requires a redundancy overhead of 200%. Another way of looking at the overhead difference between an 8+2 erasure coded group and a 3-way replication set is to consider the storage of 8 bytes in each. The 8+2 erasure coded system would require 10 bytes of storage capacity while the 3-way replication set would require 24. The resulting capacity requirement for the three-way replicated system is three bytes of for every one byte of stored application data, or 300%.

In a typical runtime scenario, where all data blocks are available, an erasure coded system may correctly satisfy requests by retrieving the appropriate data block per the application's request. When a failure occurs, one or more data blocks may no longer be available and it is here that parity blocks come into play. To recover a missing data block in an erasure coded system, the system must retrieve a number of data and parity blocks from the respective group equivalent to that group's N value. Once the set of blocks have been gathered, the contents of the missing block may be regenerated using the previously gathered blocks as inputs to the erasure code function. While erasure coding has a distinct space utilization advantage, recovery requires more data movement and processing than in a replicated HA system which merely has to locate and fetch the alternate data copy.

Fault recovery in an erasure coding system is obviously more difficult than in a replication based system due to the retrieval of N group members and the necessity to mathematically reconstruct the missing data. Unfortunately for those seeking a simple and efficient distributed erasure coding storage system, the difficulties do not end at fault recovery. The association of data and parity blocks into an erasure coded group (ECG) comes with a complication in that the group's parity blocks (M) must be actively maintained whenever any one data block (N) is modified. Otherwise, the data recovery process would yield invalid results. Properly maintaining the group's set of parity blocks requires that the group's data blocks are available in order to (re)calculate the group's parity blocks. In some cases, the entire set of data blocks is immediately available in the memory of the erasure code processor prior to the erasure code process. In other cases, such as the update of a single byte of data, some data blocks may not be present in the erasure code processor and must be fetched from their respective storage device before the erasure code process may continue. The process of fetching non-resident data blocks prior to erasure code processing is known to those skilled in the art as a "read-modify-write".

Fault tolerant storage products and open source software such as Linux have provided implementations of RAID ("Redundant Array of Independent Disks"), a form of erasure coding, which perform the read-modify-write operation as required. These fault tolerant assemblies of storage devices are typically located within the same hardware chassis or are otherwise connected with dedicated, high-bandwidth storage interface busses. The advantage of high-bandwidth, private connectivity of storage devices to the erasure coding processor is that it helps mitigate the transfer cost of read-modify-write data as well as providing known lower bounds on the transfer bandwidth. The latter is important for fault tolerant storage products to set and meet both service level agreements and objectives.

Production systems requiring highly available, fault tolerant services (as opposed to only fault tolerance) require an additional dimension of hardware added to the systems described previously to protect against the loss of one or more "controllers". In this context, we define a "controller" as a computing assembly (CPU, memory, network interface, etc.) which interfaces between the user of the storage system and the physical storage devices. Storage devices which are attached to only a single controller are susceptible to availability loss should their hosting controller fail for any reason. Addressing this single-point-of-failure requires that the storage devices be connected to one or more controllers and that the group of controllers are arranged in such a way that a partial power loss or sub-component failure, such as the failure of a memory chip, are isolated to a subset of the controllers. When a controller failure occurs the remaining controller(s) will become the primary controller for the set of drives attached to the failed controller. Once a storage system has been constructed in this manner, it may not be characterized as "shared-nothing".

Advanced implementations of the highly available, fault tolerant, RAID systems described in the previous paragraph may also employ sophisticated strategies to delay or otherwise optimize the processing of read-modify-writes in their operational pipeline. Such strategies are able to buffer the storage system from read-modify-write inducing workloads, such as those which emit small random writes, by employing supplementary hardware specialization in the form of shared data busses between controllers, battery backup, and high voltage capacitors. While these strategies cannot alleviate the read-modify-writes from occurring, they can schedule them to occur at a more suitable time. Such customized hardware assemblies are typically more expensive than generic commodity assemblies which are not concerned about preventing data loss during a power event If one seeks to construct a shared-nothing, highly available, fault tolerant storage system, which uses distributed erasure coding instead of replication, the challenges of read-modify-writes must be considered without aid of the specialized hardware. Adapting a traditional RAID storage stack to a set of shared-nothing storage servers is technically feasible using open technologies such as the Linux MD Raid stack in conjunction with iSCSI. However, such assemblies can exhibit poor characteristics since the storage traffic must use an ethernet network rather than a dedicated bus. An ethernet network will likely have a fraction of the bandwidth and be subject to network contention from other users creating unpredictability which make service level objectives difficult to meet. Additionally, a user application workload may create conditions which are detrimental to network utilization, such as in the case of small random writes across a large portion of the storage system's address space. In such cases, each write operation may require read-modify-write where all but one data block are fetched from their respective storage devices before the erasure code calculation and delivery of the updated erasure code group may proceed. The overhead in such cases may be untenably high. In a typical erasure code where N+M is 8+2, the modification of a single data block may require the reading of 7 data blocks and the writing of three (1 data and 2 parity). While standard "RAID" storage protocols, such as the one just previously described, can operate correctly on an ethernet network, common application workloads may cause serious performance inefficiencies such as increases in network utilization overhead, write operation latency (due to read-modify-write), memory buffer contention on the ECG producer, and increased CPU utilization.

A novel approach to a storage system aiming to use distributed erasure coding for HA may be to establish an invariant which declares that read-modify-writes will not be done by the system. Such an invariant removes the family of complexities associated with read-modify-writes. However, as expected, it creates a new problem which must be addressed. To understand the nature of this problem, consider the reason that a read-modify-writes exists in the first place—to provide for the logical atomicity of the erasure coded group's processing. The manifest function of atomically processing an erasure coded group is to ensure that the contents of the parity blocks reflect the group's current set of data blocks. However, there is an important latent property which must also be considered. Each group member may apply its portion of the write operation without consideration for the other members. This is because the group members can safely assume that the storing of their data block does not somehow corrupt or prevent the later recovery of their peers' blocks. Stipulating that the storage system may not employ read-modify-writes will cause a violation of this latent property. This is because the ramification of removing the read-modify-write procedure is that group sizes smaller than the desired N value may now validly occur. For instance, in the case where a single data block is modified, the "sans read-modify-write method" would allow for a group of size 1+M to be propagated to the storage system. In a typical RAID system, allowing such an operation would cause data corruption at recovery time since the entire N+M group was not maintained thus allowing for invalid parity information to be applied during reconstruction.

Addressing the problem of invalid erasure coded group data, caused by the removal of read-modify-writes and the allowance of partial group writes, requires that an abstraction layer is introduced to interpose the erasure code processor and the physical storage device. In other words, the block address provided by the erasure code processor to the storing entity does not determine the physical location at which that block's data will be stored. Erasure coded storage systems which lack such an abstraction layer are unable to support partial group write operations because they have no means to avoid invalidating the already persisted group's integrity.

Preventing data corruption requires an abstraction layer which employs a method such as "copy-on-write" or "redirect-on-write" or "RoW." Both methods allow for the preservation of existing information because they mandate that newly written data are stored to unoccupied sections of the physical device. Reconsidering the case where a group of size 1+M ($G_{partial-new}$) is written some time after a group of N+M size ($G_{complete-old}$) was written and where the data block address of $G_{partial-new}$ is contained in the address range of $G_{complete-old}$, it can be said that the data block of $G_{partial-new}$ logically overwrites or replaces a data block in $G_{complete-old}$. The logically replaced block address will be referred to as "X". Using RoW in our abstraction layer will cause two versions of the X block to exist in the system: $X_0$, which was written in $G_{complete-old}$, and $X_1$, which was the sole data block written in $G_{partial-new}$. By allowing for multiple versions of the X block to exist, the system has prevented the data corruption possibility previously described by not blindly overwriting the $X_0$ block, which is still a required component in the active $G_{complete-old}$ group.

By allowing multiple versions of a data block to coexist in the distributed erasure coding system, the system has addressed a possible data corruption scenario but it has also created a tricky garbage collection problem in the process. To prevent the leakage of storage capacity, a storage system must be able to reclaim overwritten data which are no longer otherwise referenced. In the scenario described in the previous paragraph, the $X_0$ block may no longer be visible to application users but it is referenced by the group, $G_{complete-old}$, and therefore cannot be removed until the other data blocks in $G_{complete-old}$ are also ready for removal. The aspect of being a shared-nothing system greatly complicates matters here because each storer of a group member exists on a separate computing node and therefore some form of message passing between the nodes may be required to determine when a group such as $G_{complete-old}$ may be safely garbage collected.

At this point, one could not blame most reasonable developers from abandoning the quest to remove read-modify-writes from a distributed erasure coding storage system since the ensuing garbage collection complexity may appear untenable. However, there are existing storage systems that have sought to remedy the aforementioned read-modify-write challenge by employing complex techniques such as RoW and a metadata layer specific to tracking erasure code groups. The metadata layers are designed for tracking each erasure code group in the system along with their constituent data and parity blocks such that valid garbage collection actions may be taken. Prior art patents, U.S. Pat. Nos. 8,316,188 and 9,378,088, have implemented such garbage collection strategies using metadata tables which explicitly track reference counts on the erasure coded groups' data block members. When a data block member has been completely deleted or overwritten, its reference can be removed from its group's metadata table entry and when the group has no more references, its entire set of data and parity constituents may be garbage collected. Both of the aforementioned systems have important caveats.

The system described in U.S. Pat. No. 8,316,188 utilized a relatively simple erasure code group metadata table implementation but the system itself had limited capability since the groups were required to reside within a single storage node—albeit on different storage devices within that node. As a result, the system could be considered fault tolerant, but it could not be considered "highly available" since a single storage node failure would result in data being unavailable until that node was restored.

The system described in U.S. Pat. No. 9,378,088 evolved past the high availability limitation of U.S. Pat. No. 8,316,188 by transactionally replicating its erasure coded group metadata across a predetermined set of storage servers while also distributing the erasure code group data and parity blocks across the same storage server set. This system has the advantage of being highly available, however, the cost and complexity of managing the resulting set of erasure coded group metadata, in the manner required for high availability, is quite high—especially as storage system capacities continue to increase since the number of groups is a product of the system's storage capacity. One vexing problem particular to U.S. Pat. No. 9,378,088 is that the releasability state from each constituent data block must be transactionally registered with the owners of the erasure coded group metadata. When the final data block submits its release to its respective metadata owner the process of garbage collection may proceed. While this process may appear to be relatively straightforward, in practice, it is further complicated by the need to ensure the process itself is redundant such that server failures do not lead to storage capacity leaks. The result is that high-capacity storage systems must deal with replicated pipelines containing billions of small metadata objects which are transactionally managed and require their own garbage collection from a transaction log.

Avoiding a stateful, multi-server, transactional garbage collection protocol, while not absolutely necessary, would provide a much leaner and simplified process overall. One advantageous property of the block device layer, versus the file system layer, is that the size of the data units is fixed. A storage system operating at the filesystem layer, such as those described in the preceding paragraphs, must be able to tolerate units of modifications which are arbitrary in size and alignment. Erasure coding in an environment where oddly sized data fragments are common is difficult because the erasure code group members must conform to a known fixed size as determined by the system's configuration. In other words, all N and M blocks within a system have the same size. In an effort to meet the prescribed size, the aforementioned storage systems in U.S. Pat. Nos. 8,316,188 and 9,378,088 would typically combine non-adjacent file extents into a single N data block in cases where no adjacent file extents were available. This "intra data block coalescing" of non-adjacent file extents is not property of a data block belonging to a block device since the contents are normalized such that the offset of any address within the block can be derived mathematically.

SUMMARY

The present disclosure is directed to methods for improving the efficiency of distributed, shared-nothing storage systems which use erasure coding for providing highly available virtual block devices. Today's cloud-based computing landscape is dominated by use of virtual machines (VM) and containerized processes, both of which are portable in the sense that they may be migrated to new physical hosting computers, known as "hypervisors". One prerequisite of migration is the availability of the migrating VM's virtual block device (VBD) at the destination hypervisor. Without the most recent VBD contents, the VM may not resume in a transparent manner. Today, migration is a critical process to cloud computing providers because it allows for the decoupling of hypervisor administration tasks and hardware failures from the uninterrupted operation of their customers' VMs and containerized processes. Moving forward, migration will become an increasingly crucial business component to cloud providers by enabling sophisticated overprovisioning schemes which increase total system utilization.

Today's cost competitive schemes for configuring, assigning, and managing physical storage in a massive cloud computing environment, force administrators between a set of suboptimal design choices due to the limitations of current shared-nothing storage system technologies. For serving virtual block devices, administrators can either choose a low cost storage option, which is not highly available, or an increased cost option which is highly available. Neither option provides the ability to capture the capacity savings of erasure coding in a highly available manner using standard commodity-based, shared-nothing hypervisor hardware. The highly available option, which allows for efficient VM migration, will use replication which invokes a 2-3× cost overhead per byte of storage capacity. The lower cost option utilizes a local RAID volume, where the physical storage devices of the RAID reside in the same failure domain as the hypervisor computer itself. The lack of high availability in the low cost option has two important caveats: 1) The data on the hypervisor local RAID volume is inaccessible if the hypervisor is offline; 2) Migration of a VM first requires that the VM's virtual block device contents are transferred over the network to the destination hypervisor before the VM can be moved.

The present invention aims to provide a highly available and efficient method for the storing of virtual block device data in massive scale deployments of shared-nothing server clusters which comprise most or all cloud computing facilities. The efficiency of the invention is derived from its minimal capacity overhead requirement to achieve high availability and its core storage protocols which reduce both network and metadata overhead by preventing read-modify-writes and enabling autonomous garbage collection at the storage system endpoints. These efficiencies are achieved through a unique combination of techniques involving a RoW oriented abstraction layer (at the storage system endpoint) and a metadata dissemination scheme which involves all of the storage system endpoints of a given VBD chunk. A "VBD chunk" is a fixed-size subcomponent of a VBD volume that has assigned attributes (i.e. metadata) in the global management system which list the set of SSEs where the subcomponent resides. The RoW oriented abstraction layer allows for the storage of erasure code groups which are smaller than the preferred N+M geometry for the respective VBD chunk allowing for the safe removal of read-modify-writes. The metadata dissemination scheme enables autonomous garbage collection activities to occur at the storage system endpoints by extending an innate property of a distributed replication protocol which is the replication of the respective data's metadata. In other words, if one considers the act of distributed replication, in practical terms, to be both the distribution of a data chunk and a metadata descriptor describing the size and address of the respective data chunk to a set of storage system endpoints, then it follows that the replication process itself has these two separate, albeit related, components. In its essence, the invention here combines the metadata component of a distributed replication process with a data distribution scheme that uses erasure coding.

FIGURES

DESCRIPTION

Figure 1:
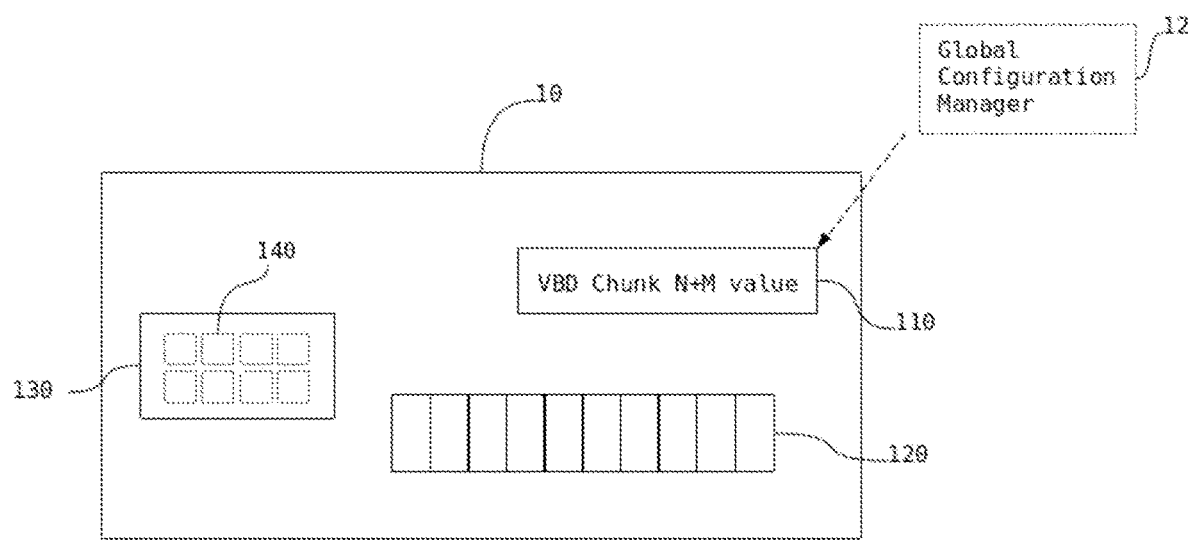
FIG. 1 is a simplified block diagram of an Erasure Coding Processor (ECP).
Figure 2:
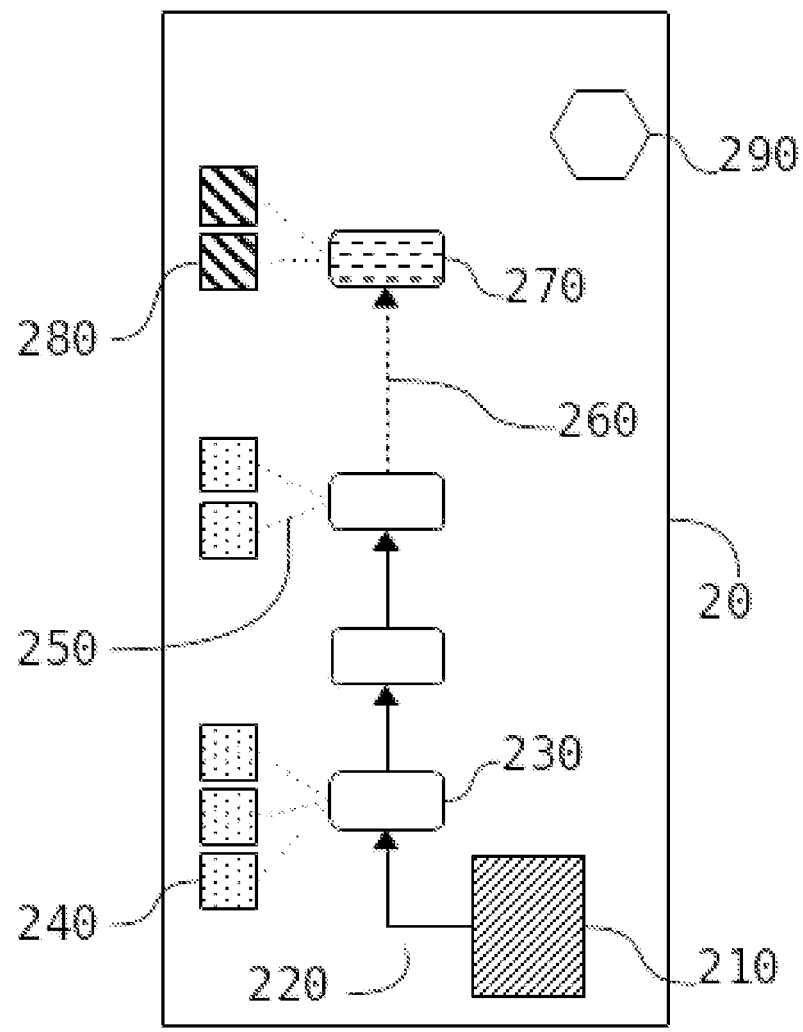
FIG. 2 is a simplified block diagram of a Storage System Endpoint (SSE) and its persistent storage layout structure.
Figure 3:
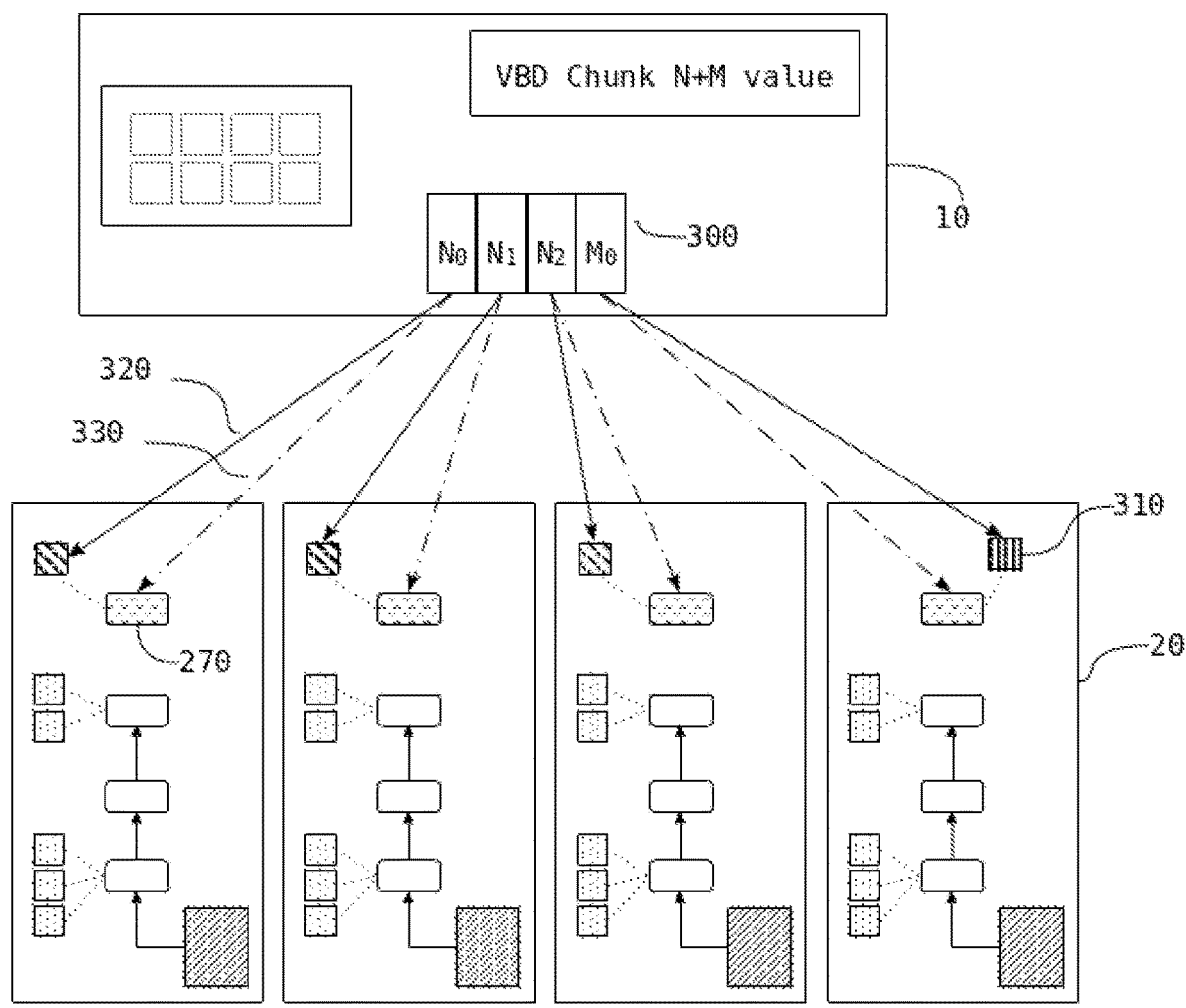
FIG. 3 is a simplified block diagram of the ECP interacting with a set of SSEs for the purposes of storing an optimally sized erasure coded group for the given VBD chunk.
Figure 4:
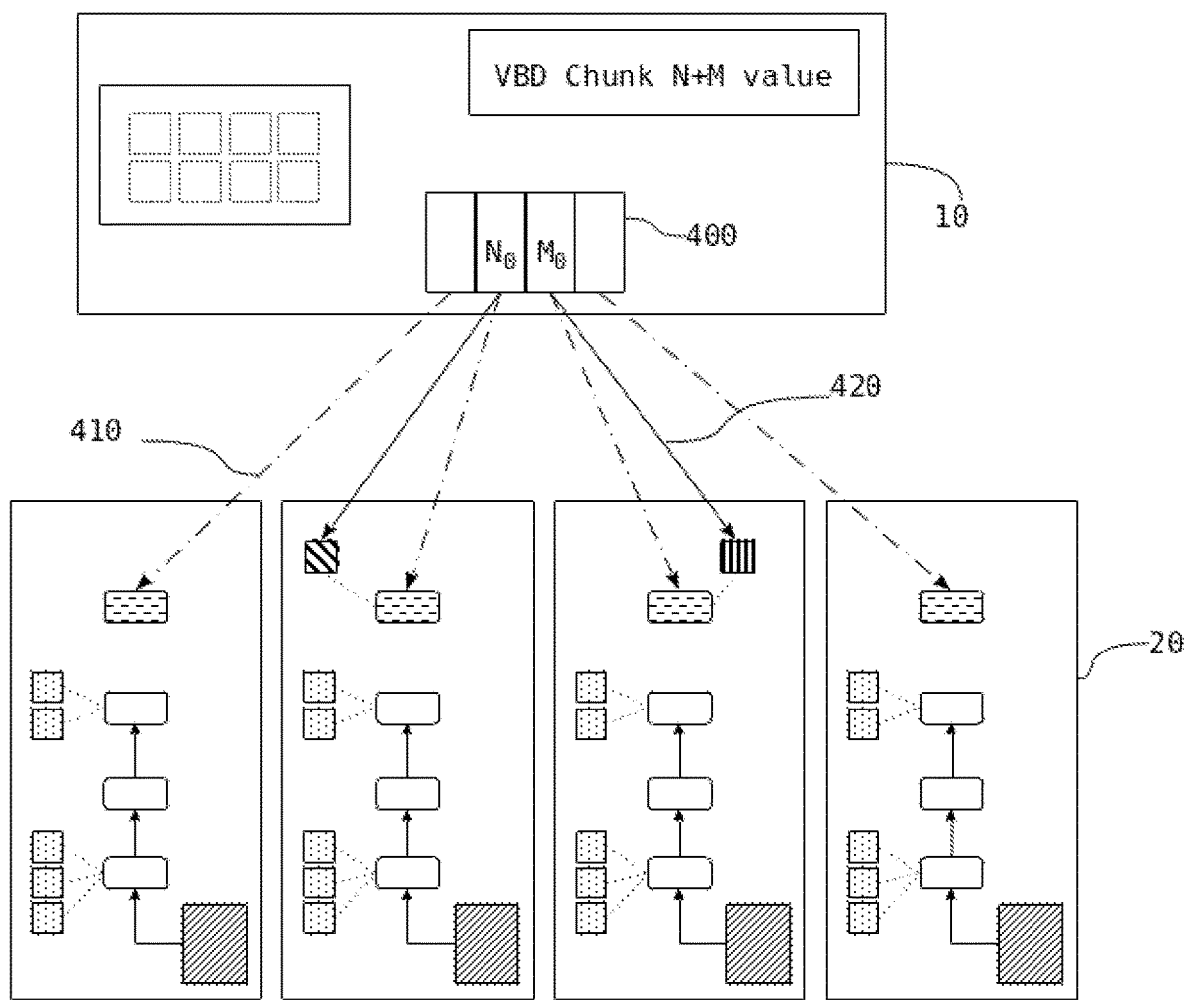
FIG. 4 is a simplified block diagram of the ECP interacting with a set of SSEs for the purposes of storing an erasure coded group which is smaller than the optimal size for the given VBD chunk

Referring to FIGS. 1-13, an erasure coding processor 10 includes a set 130 of VBD data blocks 140 to be stored. A storage system endpoint 20 (SSE) and its persistent storage layout structure is shown which includes superblock 210, metablock 230, committed parity or data blocks 240, logical link 250 of parity/data block 240 into metablock 230, written or stored data block that has not been written 280, metablock 270 that has not been persisted, and free space manager 290. FIG. 3 shows the interaction of ECP 10 with an array of SSEs 20. All embodiments of the present invention share an initial storage preparation process involving the selection of a set of VBD blocks 300 which have been marked or otherwise queued to be written into the storage system. FIG. 8, 80 and 81. The process assumes that the VBD chunk N+M value 110 and the set of SSEs 20 assigned to this VBD chunk have already been acquired from a global configuration management system 12, and that the chunk's SSEs form an array of SSE descriptors which is N+M size. The storage process may be initiated due to several conditions, such as but not limited to: 1) The pending queue size has exceeded a configured threshold; 2) A prescribed time out has been reached while items are queued; or 3) The application requests that all pending blocks are immediately written to the storage device. FIG. 10, 1000. This last item is typically referred to in storage system parlance as a "sync" operation. The preparation process considers the N+M value of the virtual block device's configuration to determine the optimal number of VBD data blocks 140 to group in preparation for erasure coding. In order for multi-block grouping to occur, the process must locate VBD blocks 140 which form a sequential set. Sequentiality is determined by the position value or "block number" of each VBD block. The maximum number of VBD blocks in a set is N and the minimum number is 1. Once a set 300 has been gathered, the target storage system endpoints 20 are chosen, FIG. 8, 82, by applying the modulo operation to each VBD data block number by the VBD chunk's N value. In other words: (storage_system_endpoint_index=VBD_block_number % VBD_chunk_N_value). The parity blocks 310 are assigned to the latter M members of the SSE array for this chunk unless the size of the VBD block set is less than N. In this case, the next index in the array is assigned to the first parity block even if this index is less than or equal to N as shown in FIG. 4. The method for assigning storage system endpoints 20 based on the VBD block numbers and the VBD chunk configuration also ensures that reads of any VBD block in the chunk may be directed to the appropriate endpoint by applying the same modulo operation (storage_system_endpoint_index=VBD_block_number % VBD chunk_N_value).

Figure 7:
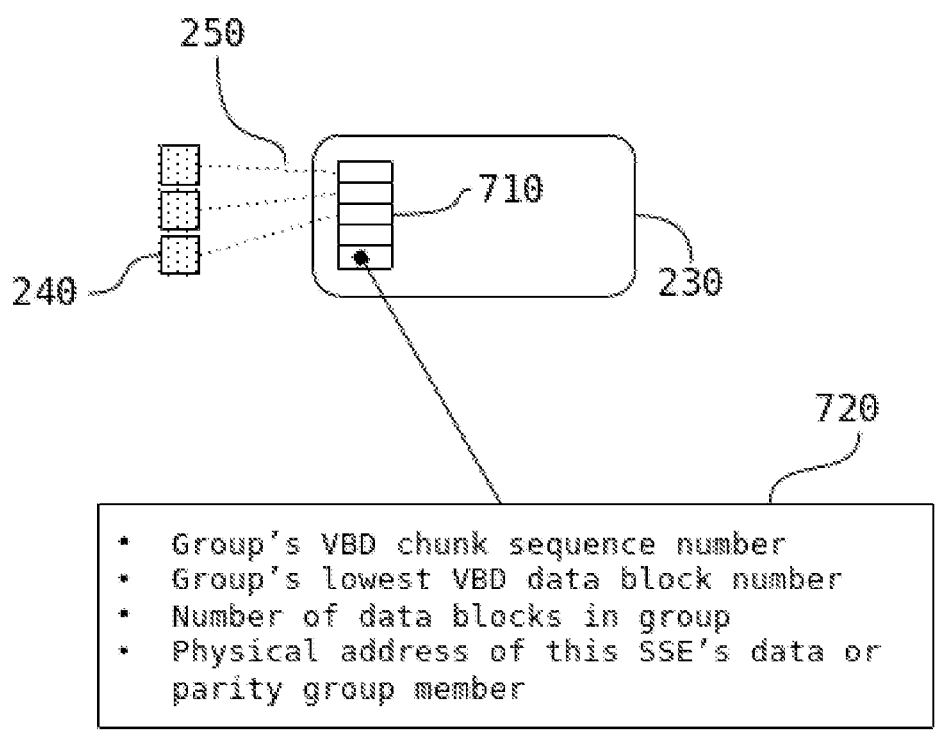
FIG. 7 is a simplified block diagram of an SSE's metablock structure.
Figure 8:
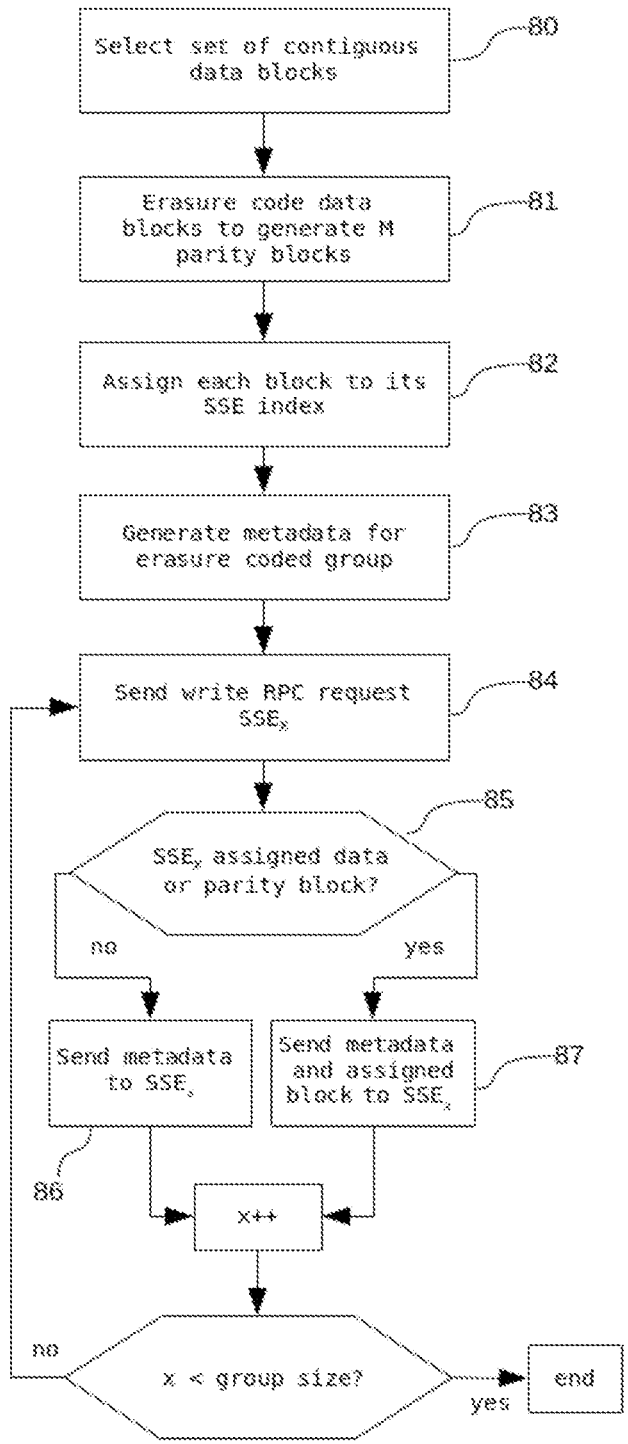
FIG. 8 is a flowchart of the erasure coding processor's process of constructing and delivering erasure coded groups to their SSEs.

As shown in FIG. 7, a set of metadata 230 is prepared, FIG. 8, 83, which will be replicated (330, 420) to all SSEs of the descriptor array regardless of being assigned a VBD block 240 (note that a VBD block may be for data or parity). The metadata elements 720 contained in the set 230 are: VBD chunk sequence number (which is monotonically increased by the erasure coding processor and uniquely identifies each erasure coded group in the VBD chunk); the request's starting block number; the number of consecutive blocks in the request; and the checksums for each VBD data block. Following the preparation of the erasure coded group's data and parity blocks 240, and the metadata set, an RPC (remote procedure call) message 320, 330, 410, 420, called here a "write RPC request", is prepared for and sent to each SSE 20 in the storage system endpoint descriptor array. FIG. 8, 84. Each SSE RPC message contains the metadata set 230, a single bit instruction signifying the request of a synchronization action (sync-bit), and the VBD block assigned to the targeted SSE, if one is present.

Figure 9:
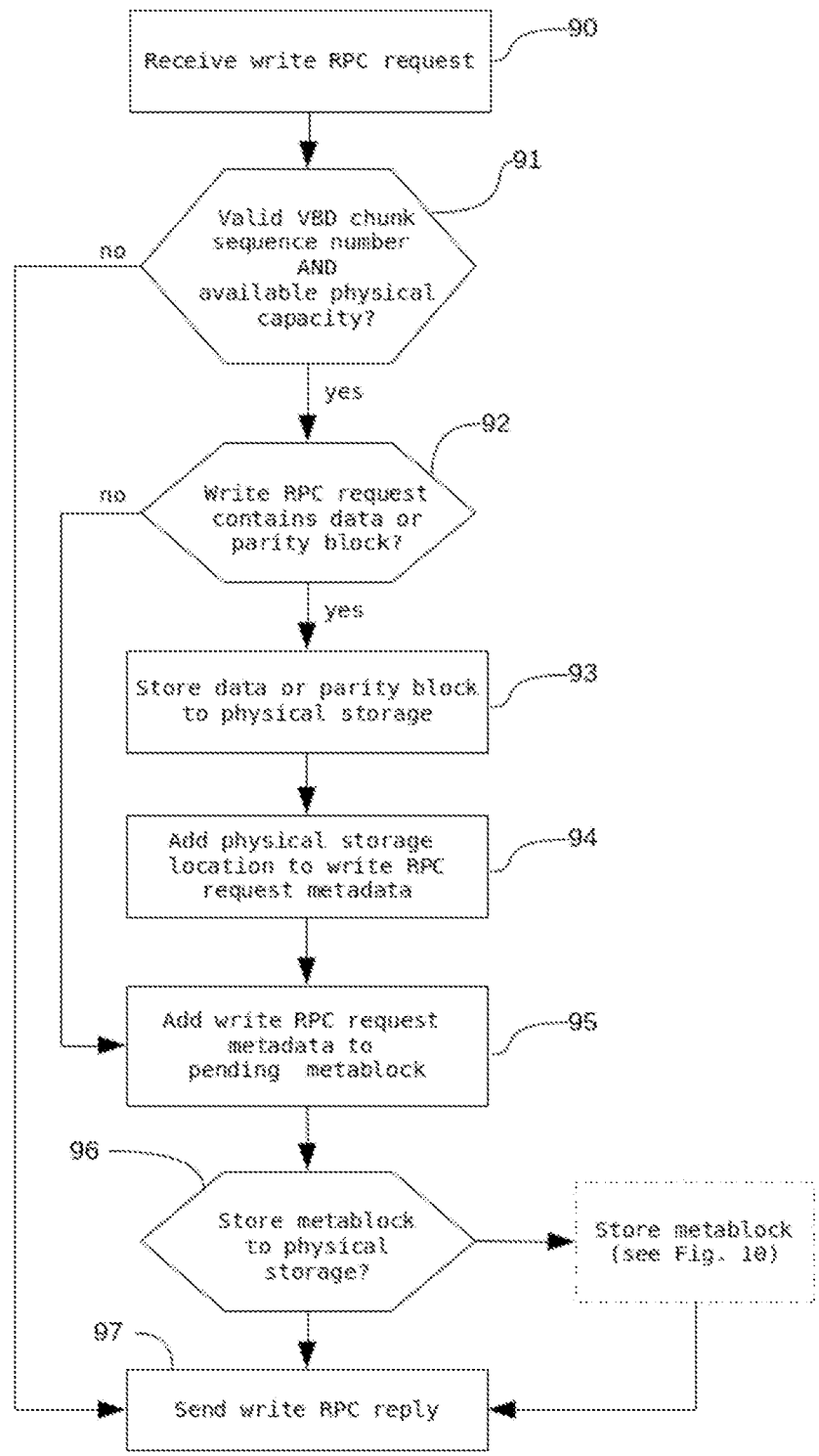
FIG. 9 is a flowchart of an SSE's process of receiving write requests from the ECP.
Figure 10:
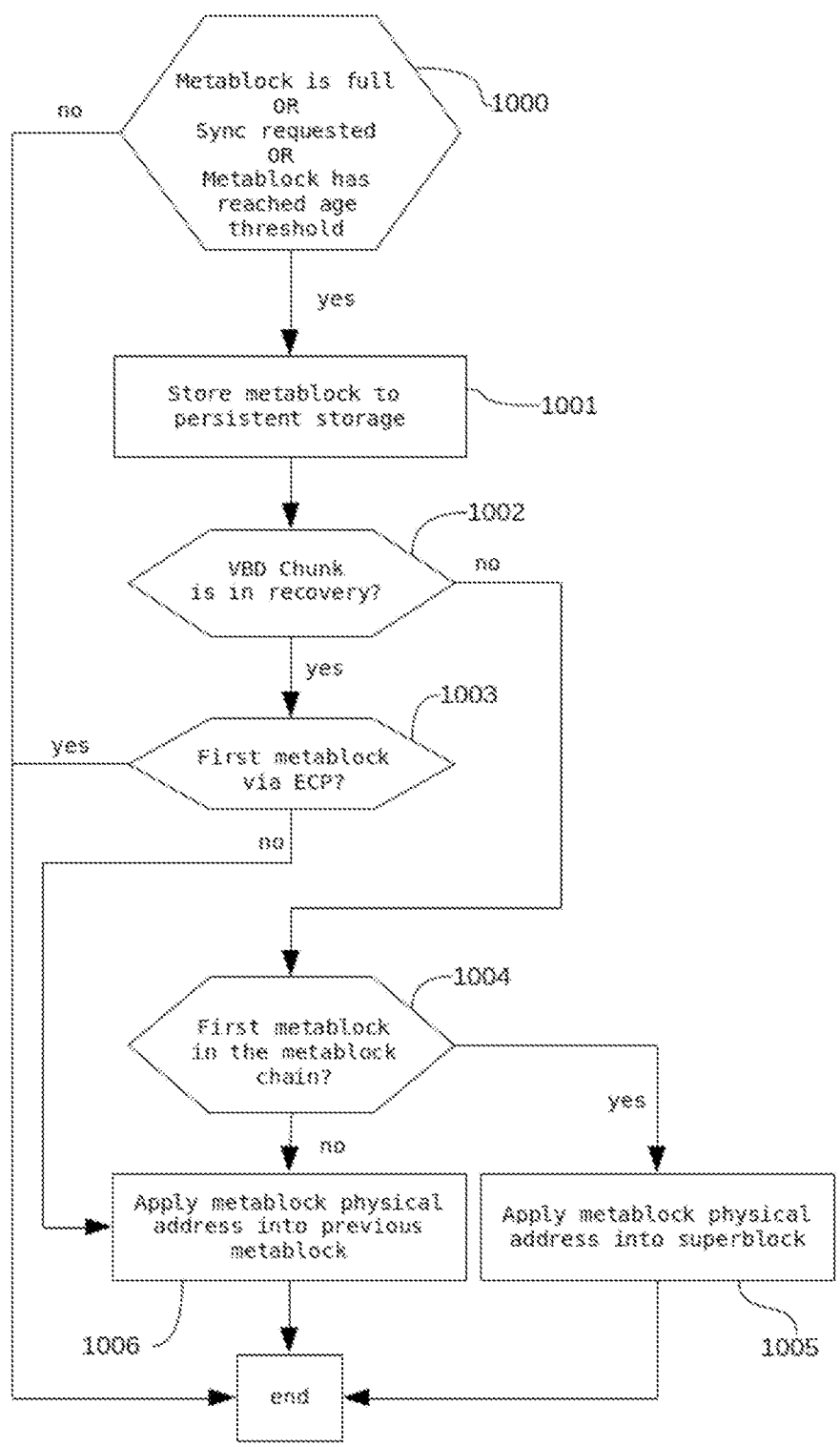
FIG. 10 is a flowchart of an SSE's process for storing and linking metablocks.

As shown in FIG. 9, 91, a storage system endpoint will accept an incoming write RPC request if the contained sequence number increments the VBD chunk's current sequence number by 1. If the sequence number is invalid, the SSE will return an error to the erasure coding processor. Otherwise, if a VBD block is present in the request, it will persistently store the block into an unoccupied region 325 of its storage device as determined by the free space manager. 92, 93. If no space is available for the incoming block, the SSE will return an error to the erasure coding processor. Otherwise, the SSE will add the metadata contents of the incoming write request along with the physical address of the written VBD block (if any) to the contents of the pending metablock 335, 94. A metablock is an entity residing on the SSE which is responsible for tracking the locations and other associated metadata with VBD parity and data blocks. A metablock may contain multiple elements of VBD metadata so it is not typically written following every write of a VBD block. However, if the write RPC request contains the synchronization bit value of '1' then the SSE may immediately write the contents of the metablock. 96 and FIG. 10. After performing the VBD block write operation and inserting the request's metadata contents, and optionally synchronizing the metablock, the SSE may issue an RPC reply message to the erasure coding processor with the status of the overall operation, the sequence number of the last written VBD block, and the highest sequence number contained in the most recently written metablock.

As shown in FIG. 10, 1000, an SSE may write a pending metablock for the following reasons 260: 1) The metablock is full and can accept no more information; 2) The erasure coding processor has requested that the current metablock is immediately written to storage; 3) A partial metablock has exceeded an age threshold and is being flushed out of memory. Each metablock is written to an unused physical location as determined by the SSE's free space manager 290. After the metablock has been successfully written to the SSE's physical device, a second write is performed which effectively links the metablock into the VBD chunk's persistent chain of metablocks. This linking write either occurs to the header of the previous metablock in the chain or, if there is no preceding metablock in the chain, to an existing or newly assigned location in the SSE's superblock 210 designated for the given VBD chunk's persistent chain. This "persistent chain" structure, which exists per VBD chunk on an SSE, can be said to have a temporal ordering where the oldest metablock is directly attached to the superblock 210 and that this ordering allows for the RoW semantics, needed for read-modify-write removal, to be expressed. It can also be said that the persistent chain provides the storage abstraction layer between the ECP and the physical devices.

After submitting the write RPC requests to all members of the SSE descriptor array, the erasure coding processor (ECP) collects the reply RPC messages from each SSE. 97. In the case where all SSEs have responded with an acknowledgement of success (i.e. ACK), the ECP will further analyze the reply messages from each SSE. If the reply message contains a last-written-VBD-block-sequence-number which is less than the sequence number of the current erasure code group, the ECP will (re)send the write RPC request to that SSE. Otherwise, if the highest-sequence-number-in-last-written-metablock is greater than or equal to that of any still pending erasure code group, the SSE index for the replying SSE is set to ACK for each. Once an erasure coded group has received an ACK in each SSE index, the group is assumed to be fully written to the SSEs and the ECP is free to reclaim any memory or storage space assigned to the erasure coded group's VBD blocks.

In the case where an erasure coding processor receives an error from an SSE via a reply RPC message, the ECP may react by retrying the request at a later time, if the error is interpreted as being transient. If such an error cannot be considered transient or if no response is received at all and timeout has been reached, the ECP may interact with the global configuration management system to select a replacement SSE. If a replacement SSE may be assigned, then the ECP's SSE descriptor array is modified to reflect the replacement of the failed SSE with a new one. Once the replacement process has completed, the ECP will direct all pending write RPC requests bound for $SSE_{failed}$ to $SSE_{replacement}$ and proceed in attempting to complete the set of write RPC requests for all pending erasure code groups.

Figure 5:
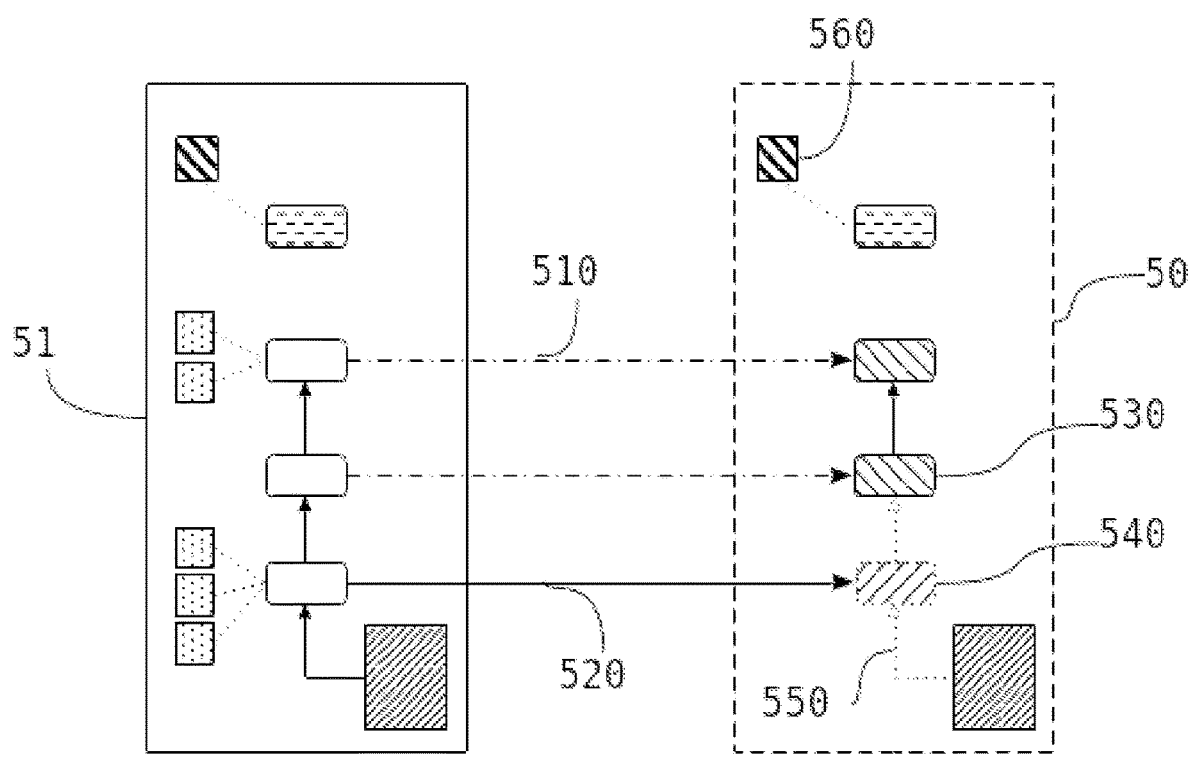
FIG. 5 is a simplified block diagram of two SSEs participating in a recovery process where the SSE on the left 51 is providing the recovering SSE 50 with the set of metablocks for the recovering chunk.
Figure 11:
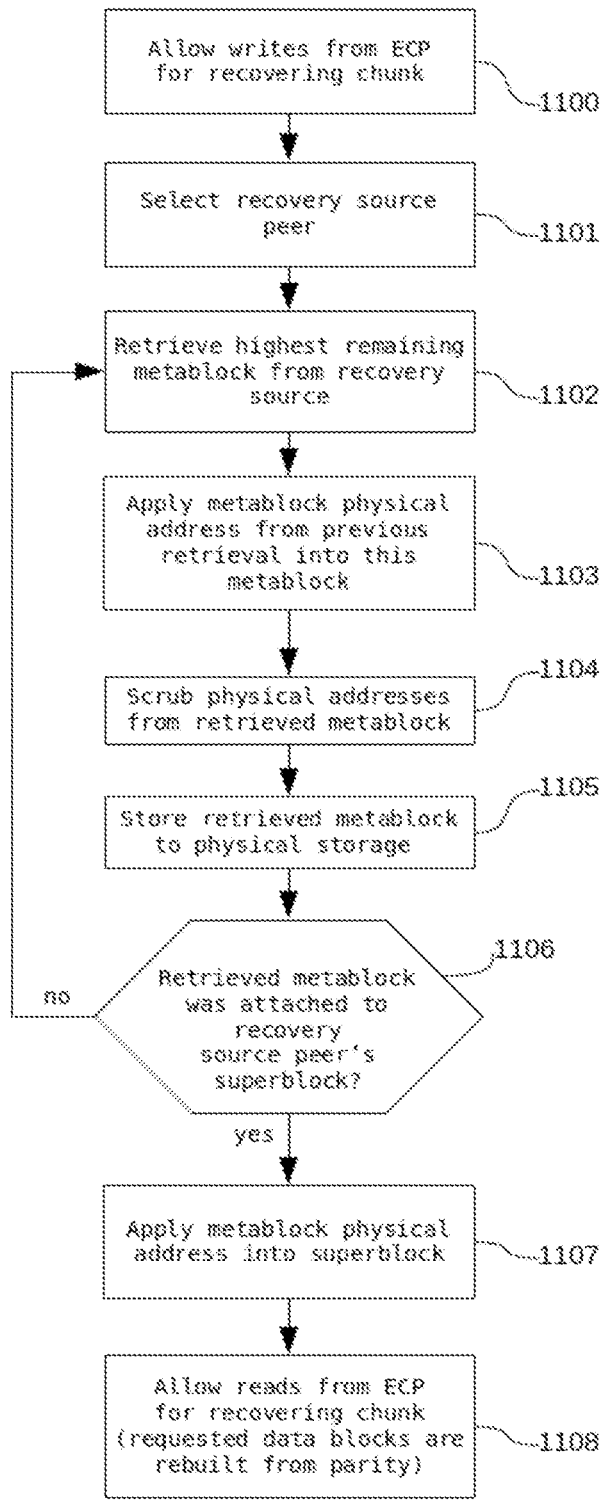
FIG. 11 is a flowchart of an SSE's process for recovering a metablock chain from a source peer.

Metablock recovery is set out in FIGS. 5 and 11. An SSE 50, which has been assigned by the global configuration management system to replace another SSE for serving a given VBD chunk, is immediately permitted to accept new write RPC requests from the chunk's ECP. 1100. It is through these requests that the SSE will learn the current VBD chunk sequence number and start to assemble a persistent chain structure for the VBD. However, at this very initial stage of recovery, the persistent chain is not yet rooted into the SSE's superblock because it is knowingly incomplete. Additionally, the SSE must refuse any read RPC requests for the recovering chunk which cannot be serviced using the partial metablock set, since the set of metadata for the chunk is still incomplete.

The next step in the recovery process of the chunk is the recreation of the persistent chain. The recovering SSE 50 selects a peer 51 which is also assigned to the VBD chunk. 1101. Any peer can be selected since the persistent chain of metablocks are functionally equivalent across all SSEs assigned to the recovering VBD chunk. Once a peer 51 is selected, the recovering SSE 50 streams 510 the set of metablocks from the highest sequence number which it does not already hold. 1102. The fetching of metablocks from the peer terminates when the oldest metablock from the remote peer has been received. Once the entire chain has been fetched, applied to storage, and verified, it is then connected to the superblock. 550, 1107. Upon completion of this step, the chain will be rooted in the superblock and also connected to any metablocks which had been established during the recovery to this point. The persistent chain is now complete and rooted but it still lacks the actual VBD block contents which were written prior to recovery. These VBD blocks must be reconstructed through the decoding of the chain's resident erasure coded groups. However, the SSE may now accept any read request. Read requests which cannot be immediately satisfied must be rebuilt on-the-fly by obtaining enough erasure coded group members to recreate the requested VBD block.

Figure 6:
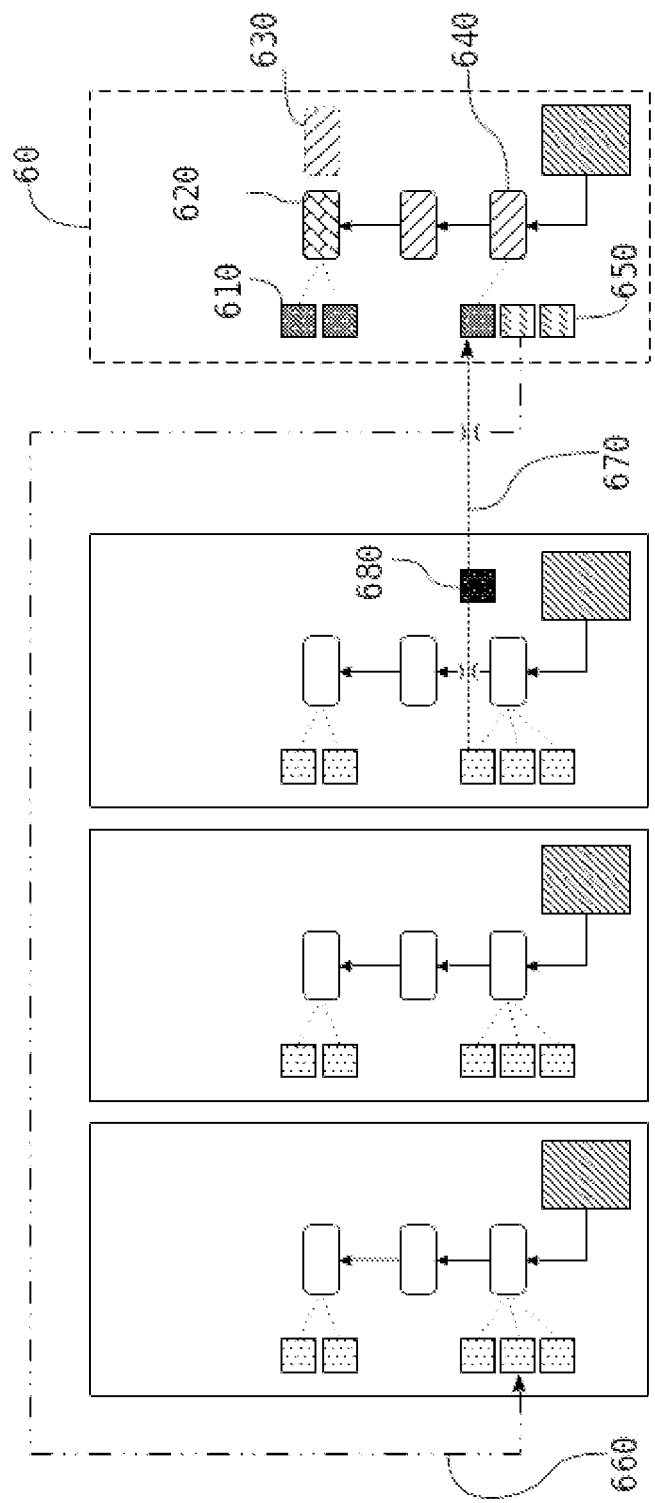
FIG. 6 is a simplified block diagram of a set of SSEs which are participating in the erasure decoding process for the set of VBD blocks on the recovering SSE 60.
Figure 12:
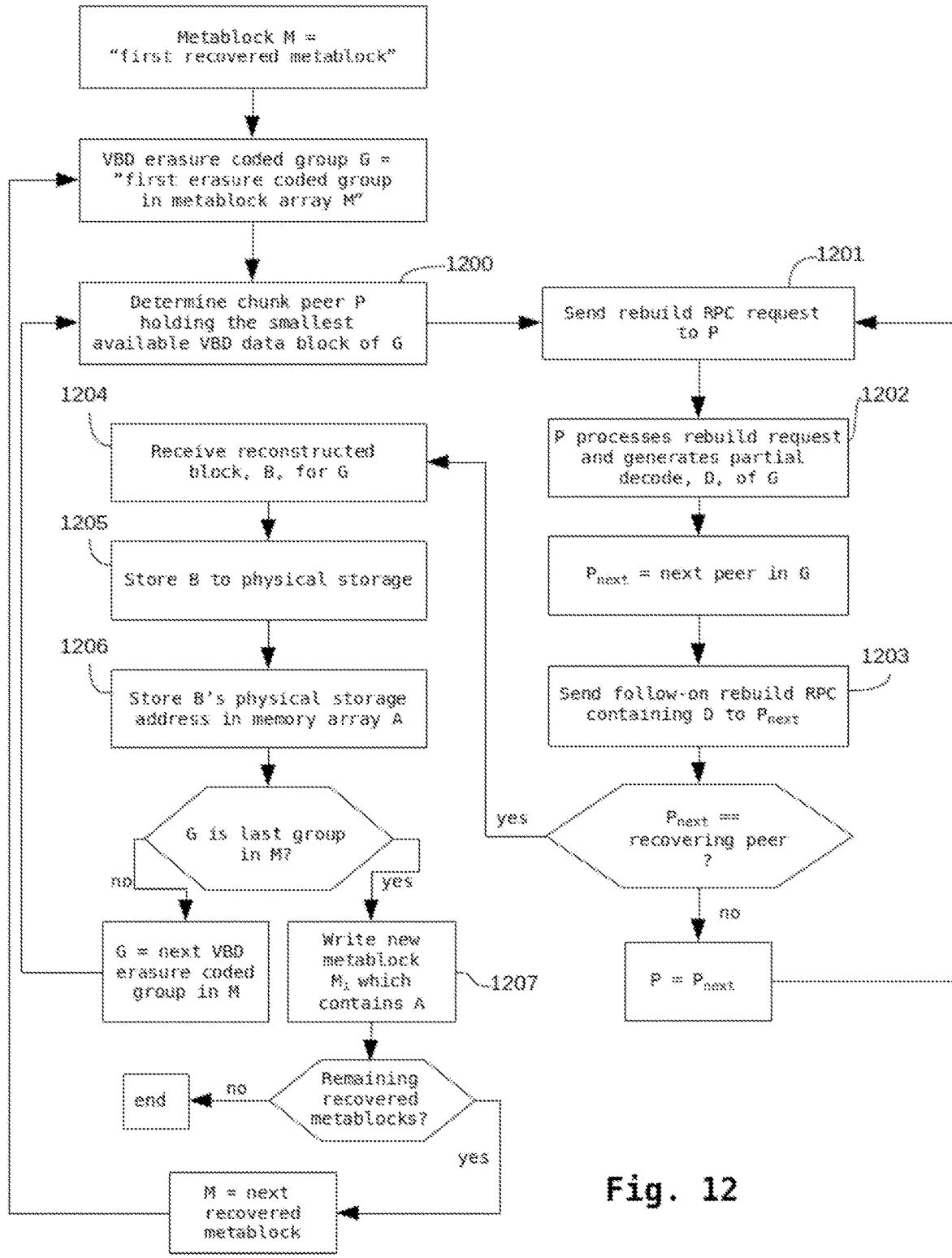
FIG. 12 is a flowchart for the VBD block recovery process involving the set of SSEs responsible for the recovering VBD chunk.

As shown in FIGS. 6 and 12, the recovery process rebuilds the missing VBD blocks by descending the persistent chain from the newest metablock established via recovery (i.e. not those which resulted from ECP write operations) to the oldest. For each erasure coded group referenced in the current metablock, the group's starting data block number is used to determine the SSE peer which will be assigned to initiate the rebuilding process of the group's missing block. This SSE is contacted through a rebuild RPC request 660 which contains the VBD chunk identifier, the sequence number of the erasure coded group, and the position being rebuilt. From here, the initial rebuilding SSE 20-1 will obtain its VBD block belonging to the specified group and send it inside of a follow-on rebuild RPC request to the next SSE 20-2 in the chunk's SSE array. Following SSE's receiving already initialized rebuild RPC requests, they will apply their VBD block component to the one provided in the request to advance the decoding process of the erased (i.e. rebuilding) block. The N'th SSE peer 20-3 in the series to successfully advance the decoding process sends the resulting block in a rebuild-completion RPC request to the recovering SSE 60. Upon receiving the rebuild-completion RPC request, the recovering SSE verifies the decoded contents against the checksum stored in the current metablock for that VBD block. If the checksum matches and sufficient capacity is available, then the rebuilt VBD block may be stored into any available area on the SSE. Once all of the current metablock's erasure coded groups have been rebuilt via the aforementioned method, a new version of the metablock is stored into the SSE and replaces the original metablock in the chunk's persistent chain. This replacement is achieved by updating the previous metablock's header to contain the address of the newly written metablock. This entire process is continued until the entire set of metablocks' groups have been rebuilt or the SSE runs out of available space.

Figure 13:
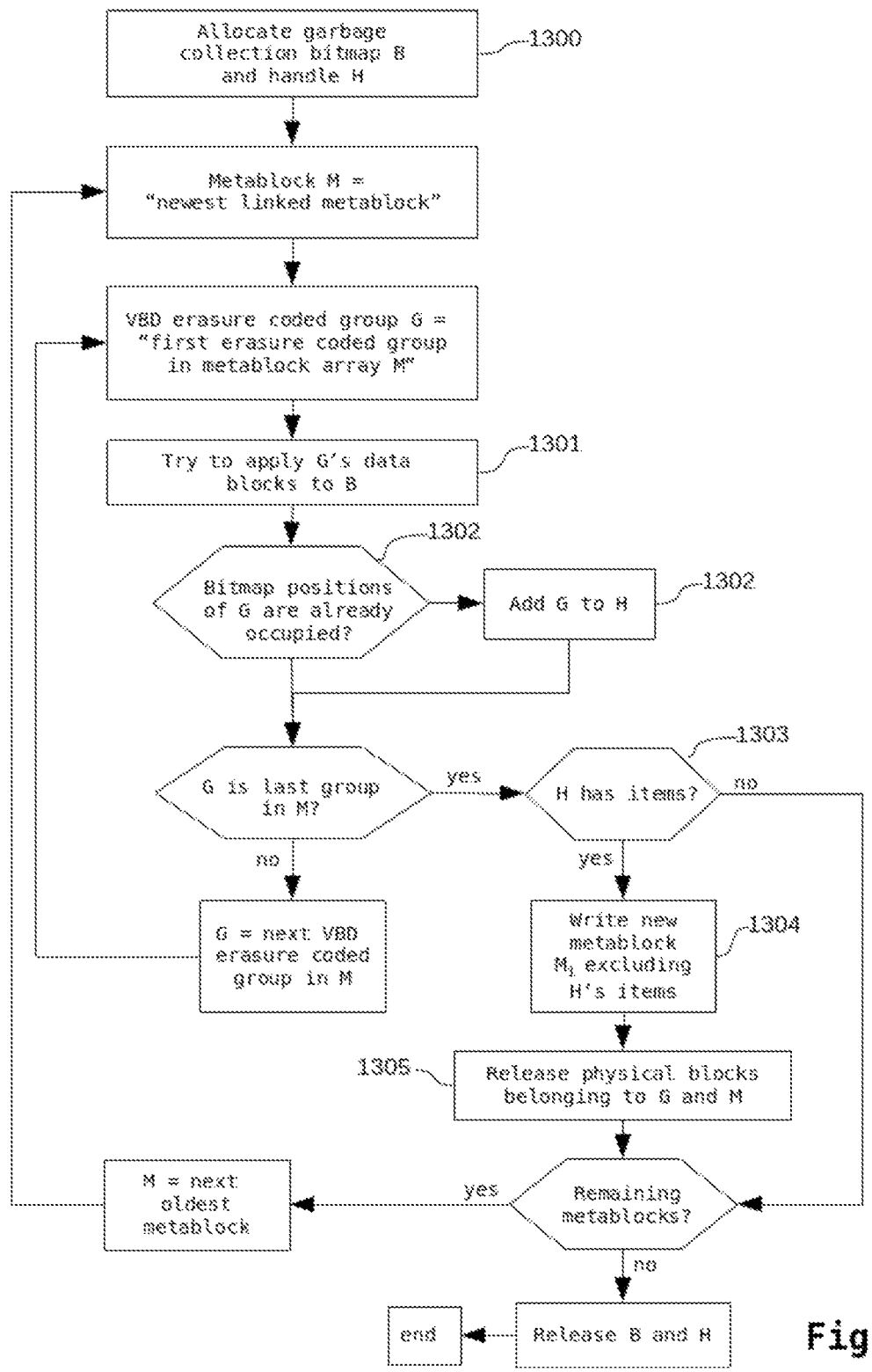
FIG. 13 is a flowchart of an SSE's autonomous garbage collection process.

As set out in FIG. 13, the present invention introduces a garbage collection method for erasure coded groups which is fully autonomous from the standpoint of each storage system endpoint. This autonomous behavior is possible because each SSE servicing an erasure coded VBD chunk has a complete and total view of all erasure coded group writes. Therefore, it can be deduced that any inputs into the chunk's metadata set are replicated and that decisions resulting from the processing of these inputs are functionally equivalent across a VBD chunk's set of SSEs. Each SSE executes a garbage collection process that considers each VBD chunk which is present in the SSE's superblock. Prior to executing the garbage collection process, a garbage collection handle is allocated to the process which contains a bitmap large enough to represent every block in the chunk and a list for holding references to releasable VBD blocks. 1300. For each VBD chunk found attached to the superblock, the garbage collection process scans the set of metablock contents starting with the newest metablock. The metablock contents, relevant to garbage collection, reside in an array whose members are ordered by the starting VBD data block number. The array member is called a "virtual block entry" or VBE and it contains the number of blocks represented by the original write RPC request which is N value of the erasure coded group size. The garbage collector iterates over the array and attempts to apply the current VBE into the bitmap. A VBE composed of X blocks, starting at block number Y, would occupy X consecutive bits in the bitmap starting at index Y. If, during the bitmap insertion process, it is found that all bits associated with the current VBE are already occupied, then the VBD block referenced by the VBE is releasable and the VBE contents are placed into a VBD reference list inside the garbage collector handle. Upon the completion of each metablock, if the garbage collector handle's VBD reference list contains items then a new metablock will be composed which does not contain the VBEs listed in the garbage collection handle. This new metablock will first be written into an unoccupied physical block of storage and "spliced" into the persistent chain by overwriting the header of the previous metablock. At this point, the original metablock and the VBD blocks referenced by in the garbage collection handle list may be reclaimed by presenting their physical block numbers to the free space manager.

The invention claimed is:

1. A method for erasure coded group management comprising:

Selecting a first set of a first number N contiguous data blocks;
Using an erasure coding processor to erasure code the first set of N contiguous data blocks to generate a first set of a second number M parity blocks;
Identifying an N+M array of successive storage system endpoints (SSEs);
Assigning each one of the first set of N contiguous data blocks and the first set of M parity blocks to the successive SSEs contained in the array of SSEs;
Generating a first set of metadata for each data block in the first set of N contiguous data blocks;
Sending a first write remote procedure call (RPC) request to each SSE that has been assigned the N contiguous data blocks or M parity blocks from the first set;
Replicating the first set of metadata to all SSEs in the array of SSEs;
Storing the first set of N contiguous data blocks or M parity blocks to a first available physical storage location on SSE that has been assigned to the first set of N contiguous data blocks or M parity blocks;
Adding the physical location of each of the first set of data or parity blocks to the first set of metadata on the assigned SSE;
Adding the first set of metadata to a first metablock until the first metablock is full or sync is requested or the first metablock has reached an age threshold;
Persisting the first metablock to a second available physical storage location on the respectively assigned SSE; and
Applying a second physical storage location into a superblock located on the respectively assigned SSE.

2. The method according to claim 1 further comprising:
Selecting a second set of N contiguous data blocks;
Erasure coding the second set of N contiguous data blocks to generate a second set of M parity blocks;
Assigning the second sets of set of N contiguous data blocks and the second set of M parity blocks to successive SSEs of the SSE array;
Generating a second set of metadata for the second set of N contiguous data blocks;
Sending a second write RPC request to each SSE that has been assigned at least one of the N contiguous data blocks from the second set of N contiguous data blocks or at least one of the M parity blocks from the second set of M parity blocks;
Replicating the second set of metadata to all SSEs in the SSE array;
Storing the second set N contiguous data blocks or the second set of M parity blocks to a third available physical storage location on the respectively assigned SSE index;
Adding the physical location of each of the second set of N contiguous data blocks or the second set of M parity blocks to the second set of metadata;
Adding the second set of metadata to a second metablock until the second metablock is full or sync is requested or the second metablock has reached the age threshold;
Persisting the second metablock to a fourth available physical storage location on the assigned SSE; and
Applying fourth physical storage location into the first metablock on the assigned SSE.

3. The method according to claim 2 further comprising
Selecting a plurality of subsequent sets of N contiguous data blocks;
Erasure coding each subsequent set of N contiguous data blocks to generate a plurality of subsequent sets of M parity blocks;
Assigning each one of the subsequent sets of N contiguous data blocks and each one of the subsequent sets of M parity blocks to successive SSEs of the SSE array;
Generating subsequent sets of metadata for each subsequent set of N contiguous data blocks
Sending a subsequent write RPC request to each SSE index that has been assigned the subsequent sets of N contiguous data blocks or subsequent sets of M parity blocks;
Replicating a plurality of subsequent sets of metadata to all SSEs SSE indexes in the SSE array;
Storing the subsequent sets of N contiguous data blocks or subsequent sets of M parity blocks to a plurality of subsequent available physical storage locations on the assigned SSEs;
Adding the physical location of each of the subsequent set of N contiguous data or each of the subsequent set of M parity blocks to a subsequent set of metadata;
Adding the subsequent set of metadata to a subsequent metablock until the subsequent metablock is full or sync is requested or the subsequent metablock has reached the age threshold;
Storing the subsequent metablocks to a plurality of subsequent available physical storage location on the assigned SSEs;
Applying subsequent physical storage location into a last metablock that had been previously stored on the respectively assigned SSE.

4. A method for erasure coded group management comprising:
Selecting a plurality of sets of less than a first number N data blocks
Erasure coding the plurality of sets of less than N set of data blocks to generate a plurality of sets of a second number M parity blocks;
Identifying an N+M array of SSEs;
Assigning each one of the sets of less than N data blocks and each one of the sets of M parity blocks to one of the SSEs of the SSE array;
Generating a first set of metadata for each one of the sets of less than N data blocks;
Sending a write RPC request to each SSE that has been assigned the sets of less than N data blocks or the sets of M parity blocks;
Replicating the generated first set of metadata to all SSEs in the array of SSEs;
Storing each of the sets of less than N data blocks or sets of M parity blocks to available physical storage locations on the SSEs to which they were assigned;
Adding the physical location of each of the data or parity blocks to the first set of metadata;
Adding the generated first set of metadata to a plurality of metablocks until a one or more of the metablocks is full or sync is requested or a subsequent metablock has reached an age threshold;
Storing the metablocks to a subsequent available physical storage location; and
Applying the subsequent physical storage location into a last metablock that had been previously stored, or to a superblock if no previous metablocks have been stored, on the respective assigned SSE.

5. The method according to claim 2 further comprising
Allowing writes from an erasure coding process for recovering a data chunk;
Selecting a recovery source peer by a global configuration manager;
Retrieving a last stored metablock on a recovery source peer and designating the retrieved metablock as a first recovered metablock;
Persisting the first recovered metablock to a first physical storage address on a replacement peer;
Determining whether the first retrieved metablock had been attached to the superblock of the recovery source peer and if so applying the first physical storage address on the replacement peer into a superblock of replacement peer; if first retrieved metablock was not attached to the superblock of the recovery source peer, retrieving a second metablock on the recovery source peer that had been stored previously to the last stored metablock and storing the second metablock to a second physical storage address on the replacement peer, and continuing said retrieval, storage, and address applications until the retrieved metablock that is attached to the superblock on the recovery source peer is retrieved, stored, and its address applied to the superblock.

6. The method according to claim 5 further comprising:
Determining a first erasure coded set in the first recovered metablock;
Sending a first rebuild RPC request for the first erasure coded set to a rebuilding source peer;
Generating a first decode of requested erasure coded set from the rebuilding source peer;
Migrating the first decode to subsequent rebuilding source peers wherein subsequent decodes of subsequent erasure coded sets are gathered and the gathered decodes are migrated through to the replacement peer;
Persisting recovered data or parity blocks from the first erasure coded set on the replacement peer;
Capturing a recovered data or parity block physical address, modifying the first recovered metablock with the physical address of the recovered data or parity block.

7. The method according to claim 6 further comprising determining whether additional erasure coded sets are contained in the first recovered metablock; if so, repeating for each additional erasure coded set the steps of sending rebuild RPC requests, generating decodes of said additional erasure coded sets, migrating and gathering said decodes, persisting said additional recovered data or parity blocks, capturing a physical address of the recovered data or parity block and modifying the recovered metablock; if not, storing the recovered metablock at a final address.

8. The method according to claim 7 further comprising:
Determining whether additional metablocks have been recovered and stored to the replacement peer; if so, determining the first erasure coded set in a first additional recovered metablock;
Sending a rebuild RPC request for the first erasure coded set contained in the first additional recovered metablock to the rebuilding source peer;
Generating a first decode of the first requested erasure coded set contained in the first additional recovered metablock from the rebuilding source peer;
Migrating the first decode of the first requested erasure coded set contained in the first additional recovered metablock to subsequent rebuilding source peers wherein subsequent decodes of the first erasure coded set of the first additional recovered metablock are gathered and said gathered decodes are migrated through to the replacement peer;
Persisting the recovered data or parity block from the first requested erasure coded set contained in the first additional recovered metablock on the replacement peer;
Capturing a physical address of the recovered data or parity block of the first erasure coded set contained on the first additional recovered metablock and modifying first additional recovered metablock with the physical address of recovered data or parity block;
Determining whether additional erasure coded sets are contained in the first additional recovered metablock; if so, repeating for each additional erasure coded set in the first additional recovered metablock set the steps of sending rebuild RPC requests, generating decodes of said additional sets, migrating and gathering said decodes, persisting said recovered data or parity blocks, capturing the recovered data or parity block physical addresses and modifying the recovered metablock; if not, storing the recovered metablock at the final address;
Determining whether one or more further additional metablocks have been recovered and stored to the replacement peer; if so, repeating consecutively for each further additional recovered metablock, the steps of determining erasure coded sets, sending rebuild RPC request to subsequent rebuilding source peers, generating the decodes, migrating the decodes to the subsequent rebuilding source peers, gathering said decodes and migrating gathered decodes through to the replacement peer, persisting recovered data or parity block on the replacement peer, capturing recovered data or parity block physical addresses and modifying further additional recovered metablocks; until the metablock that is attached to the superblock of the replacement peer is modified, then modifying the superblock to apply the physical address of the last recovered modified metablock.

9. The method according to claim 1 wherein the metadata comprises a sequence number of a first erasure coded set, a lowest data block number, a number of data blocks in the first erasure coded set, and a plurality of checksums for the N contiguous data blocks and M parity blocks belonging to the first erasure coded set.

* * * * *